United States Patent
Yamanaka (10) Patent No.: US 10,672,444 B1
(45) Date of Patent: Jun. 2, 2020

(54) DECODER UNIT

(71) Applicant: MICRON TECHNOLOGY, INC., Boise, ID (US)

(72) Inventor: Satoshi Yamanaka, Tachikawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/219,671

(22) Filed: Dec. 13, 2018

(51) Int. Cl.
*G11C 8/00* (2006.01)
*G11C 8/10* (2006.01)
*G11C 11/408* (2006.01)
*G11C 8/08* (2006.01)

(52) U.S. Cl.
CPC .................. *G11C 8/10* (2013.01); *G11C 8/08* (2013.01); *G11C 11/4087* (2013.01)

(58) Field of Classification Search
CPC .......... G11C 8/10; G11C 8/08; G11C 11/4087
USPC .................................................... 365/230.06
See application file for complete search history.

(56) References Cited

U.S. PATENT DOCUMENTS

| | | | | |
|---|---|---|---|---|
| 5,500,814 A | * | 3/1996 | Kinoshita | ........... G06F 11/1076 365/49.11 |
| 5,577,223 A | * | 11/1996 | Tanoi | .................. G11C 11/4087 711/118 |
| 7,009,893 B2 | * | 3/2006 | Choi | ........................ G11C 8/12 365/189.08 |
| 9,418,711 B2 | * | 8/2016 | Ohgami | ................. G11C 5/025 |

* cited by examiner

*Primary Examiner* — Tha-O H Bui
(74) *Attorney, Agent, or Firm* — Dorsey & Whitney LLP (57) ABSTRACT

Provided herein is an apparatus that includes an address output circuit configured to output a first address signal including a plurality of bits including a first bit section and a second bit section, and a decoder circuit configured to decode the first address signal to generate a second address signal. The decoder circuit decides an output value of the second address signal based on the first bit section when a value of the second bit section is in a first value range. The decoder circuit decides the output value of the second address signal regardless of the first bit section when a value of the second bit section is in a second value range.

20 Claims, 6 Drawing Sheets

| | XADDi 12 11 10 9 8 7 6 5 4 3 2 1 0 | RED | RA123 5 4 3 2 1 0 |
|---|---|---|---|
| MAT0 | 0 0 0 0 0 0 0 0 0 0 0 0 0<br>0 0 0 1 1 1 0 0 0 1 1 1 1 | | 0 0 1 0 0 1 |
| MAT1 | 0 0 1 0 0 0 0 0 0 0 0 0 0<br>0 0 1 1 1 1 0 0 0 1 1 1 1 | | 0 0 1 0 1 0 |
| MAT2 | 0 1 0 0 0 0 0 0 0 0 0 0 0<br>0 1 0 1 1 1 0 0 0 1 1 1 1 | | 0 0 1 1 0 0 |
| MAT3 | 0 1 1 0 0 0 0 0 0 0 0 0 0<br>0 1 1 1 1 1 0 0 0 1 1 1 1 | | 0 1 0 0 0 1 |
| MAT4 | 1 0 0 0 0 0 0 0 0 0 0 0 0<br>1 0 0 1 1 1 0 0 0 1 1 1 1 | | 0 1 0 0 1 0 |
| MAT5 | 1 0 1 0 0 0 0 0 0 0 0 0 0<br>1 0 1 1 1 1 0 0 0 1 1 1 1 | | 0 1 0 1 0 0 |
| MAT6 | 1 1 0 0 0 0 0 0 0 0 0 0 0<br>1 1 0 1 1 1 0 0 0 1 1 1 1 | | 1 0 0 0 0 1 |
| MAT7 | 1 1 1 0 0 0 0 0 0 0 0 0 0<br>1 1 1 1 1 1 0 0 0 1 1 1 1 | 0 | 1 0 0 0 1 0 |
| MAT8 | 0 0 0 1 1 1 0 0 1 0 0 0 0<br>0 0 0 1 1 1 1 1 1 1 1 1 1<br>0 0 1 1 1 1 0 0 1 0 0 0 0<br>0 0 1 1 1 1 1 1 1 1 1 1 1<br>0 1 0 1 1 1 0 0 1 0 0 0 0<br>0 1 0 1 1 1 1 1 1 1 1 1 1<br>0 1 1 1 1 1 0 0 1 0 0 0 0<br>0 1 1 1 1 1 1 1 1 1 1 1 1<br>1 0 0 1 1 1 0 0 1 0 0 0 0<br>1 0 0 1 1 1 1 1 1 1 1 1 1<br>1 0 1 1 1 1 0 0 1 0 0 0 0<br>1 0 1 1 1 1 1 1 1 1 1 1 1<br>1 1 0 1 1 1 0 0 1 0 0 0 0<br>1 1 0 1 1 1 1 1 1 1 1 1 1<br>1 1 1 1 1 1 0 0 1 0 0 0 0<br>1 1 1 1 1 1 1 1 1 1 1 1 1 | | 1 0 0 1 0 0 |
| | 0 0 0 0 0 0 0 0 0 0 0 0 0<br>0 0 0 0 0 0 0 0 0 1 1 1 1 | 1 | |

Upper Bit Section / Lower Bit Section

FIG. 4

| | XADDi | | | | | | | | | | | | | RED | RA123 | | | | | |
|---|---|---|---|---|---|---|---|---|---|---|---|---|---|---|---|---|---|---|---|---|
| | 12 | 11 | 10 | 9 | 8 | 7 | 6 | 5 | 4 | 3 | 2 | 1 | 0 | | 5 | 4 | 3 | 2 | 1 | 0 |
| MAT0 | 0 | 0 | 0 | 0 | 0 | 0 | 0 | 0 | 0 | 0 | 0 | 0 | 0 | 0 | 0 | 0 | 1 | 0 | 0 | 1 |
| | 0 | 0 | 0 | 1 | 1 | 1 | 0 | 0 | 0 | 1 | 1 | 1 | 1 | | | | | | | |
| MAT8 | 0 | 0 | 0 | 1 | 1 | 1 | 0 | 0 | 1 | 0 | 0 | 0 | 0 | 0 | 1 | 0 | 0 | 1 | 0 | 0 |
| | 0 | 0 | 0 | 1 | 1 | 1 | 1 | 1 | 1 | 1 | 1 | 1 | 1 | | | | | | | |
| MAT1 | 0 | 0 | 1 | 0 | 0 | 0 | 0 | 0 | 0 | 0 | 0 | 0 | 0 | 0 | 0 | 0 | 1 | 0 | 1 | 0 |
| | 0 | 0 | 1 | 1 | 1 | 1 | 0 | 0 | 0 | 1 | 1 | 1 | 1 | | | | | | | |
| MAT8 | 0 | 0 | 1 | 1 | 1 | 1 | 0 | 0 | 1 | 0 | 0 | 0 | 0 | 0 | 1 | 0 | 0 | 1 | 0 | 0 |
| | 0 | 0 | 1 | 1 | 1 | 1 | 1 | 1 | 1 | 1 | 1 | 1 | 1 | | | | | | | |
| MAT2 | 0 | 1 | 0 | 0 | 0 | 0 | 0 | 0 | 0 | 0 | 0 | 0 | 0 | 0 | 0 | 0 | 1 | 1 | 0 | 0 |
| | 0 | 1 | 0 | 1 | 1 | 1 | 0 | 0 | 0 | 1 | 1 | 1 | 1 | | | | | | | |
| MAT8 | 0 | 1 | 0 | 1 | 1 | 1 | 0 | 0 | 1 | 0 | 0 | 0 | 0 | 0 | 1 | 0 | 0 | 1 | 0 | 0 |
| | 0 | 1 | 0 | 1 | 1 | 1 | 1 | 1 | 1 | 1 | 1 | 1 | 1 | | | | | | | |
| MAT3 | 0 | 1 | 1 | 0 | 0 | 0 | 0 | 0 | 0 | 0 | 0 | 0 | 0 | 0 | 0 | 1 | 0 | 0 | 0 | 1 |
| | 0 | 1 | 1 | 1 | 1 | 1 | 0 | 0 | 0 | 1 | 1 | 1 | 1 | | | | | | | |
| MAT8 | 0 | 1 | 1 | 1 | 1 | 1 | 0 | 0 | 1 | 0 | 0 | 0 | 0 | 0 | 1 | 0 | 0 | 1 | 0 | 0 |
| | 0 | 1 | 1 | 1 | 1 | 1 | 1 | 1 | 1 | 1 | 1 | 1 | 1 | | | | | | | |
| MAT4 | 1 | 0 | 0 | 0 | 0 | 0 | 0 | 0 | 0 | 0 | 0 | 0 | 0 | 0 | 0 | 1 | 0 | 0 | 1 | 0 |
| | 1 | 0 | 0 | 1 | 1 | 1 | 0 | 0 | 0 | 1 | 1 | 1 | 1 | | | | | | | |
| MAT8 | 1 | 0 | 0 | 1 | 1 | 1 | 0 | 0 | 1 | 0 | 0 | 0 | 0 | 0 | 1 | 0 | 0 | 1 | 0 | 0 |
| | 1 | 0 | 0 | 1 | 1 | 1 | 1 | 1 | 1 | 1 | 1 | 1 | 1 | | | | | | | |
| MAT5 | 1 | 0 | 1 | 0 | 0 | 0 | 0 | 0 | 0 | 0 | 0 | 0 | 0 | 0 | 0 | 1 | 0 | 1 | 0 | 0 |
| | 1 | 0 | 1 | 1 | 1 | 1 | 0 | 0 | 0 | 1 | 1 | 1 | 1 | | | | | | | |
| MAT8 | 1 | 0 | 1 | 1 | 1 | 1 | 0 | 0 | 1 | 0 | 0 | 0 | 0 | 0 | 1 | 0 | 0 | 1 | 0 | 0 |
| | 1 | 0 | 1 | 1 | 1 | 1 | 1 | 1 | 1 | 1 | 1 | 1 | 1 | | | | | | | |
| MAT6 | 1 | 1 | 0 | 0 | 0 | 0 | 0 | 0 | 0 | 0 | 0 | 0 | 0 | 0 | 1 | 0 | 0 | 0 | 0 | 1 |
| | 1 | 1 | 0 | 1 | 1 | 1 | 0 | 0 | 0 | 1 | 1 | 1 | 1 | | | | | | | |
| MAT8 | 1 | 1 | 0 | 1 | 1 | 1 | 0 | 0 | 1 | 0 | 0 | 0 | 0 | 0 | 1 | 0 | 0 | 1 | 0 | 0 |
| | 1 | 1 | 0 | 1 | 1 | 1 | 1 | 1 | 1 | 1 | 1 | 1 | 1 | | | | | | | |
| MAT7 | 1 | 1 | 1 | 0 | 0 | 0 | 0 | 0 | 0 | 0 | 0 | 0 | 0 | 0 | 1 | 0 | 0 | 0 | 1 | 0 |
| | 1 | 1 | 1 | 1 | 1 | 1 | 0 | 0 | 0 | 1 | 1 | 1 | 1 | | | | | | | |
| MAT8 | 1 | 1 | 1 | 1 | 1 | 1 | 0 | 0 | 1 | 0 | 0 | 0 | 0 | 0 | 1 | 0 | 0 | 1 | 0 | 0 |
| | 1 | 1 | 1 | 1 | 1 | 1 | 1 | 1 | 1 | 1 | 1 | 1 | 1 | | | | | | | |
| | 0 | 0 | 0 | 0 | 0 | 0 | 0 | 0 | 0 | 0 | 0 | 0 | 0 | 1 | | | | | | |
| | 0 | 0 | 0 | 0 | 0 | 0 | 0 | 0 | 0 | 1 | 1 | 1 | 1 | | | | | | | |

Upper Bit Section | Lower Bit Section

FIG. 5

DECODER UNIT

BACKGROUND

When the number of bits of a signal (for example, an address signal) to be decoded by a decoder is large, it is possible to reduce the circuit size of the decoder by employing a pre-decoding method in which a signal to be decoded is divided into a plurality of bit sections and the signal is decoded for each bit section. For example, in a memory device such as a DRAM, there is a case of employing a method in which any one of a plurality of memory mats is selected by decoding an upper bit section of a row address and a lower bit section of the row address is decoded, thereby selecting any one of a plurality of word lines included in the selected memory mat. This method is very effective when the number of memory mats is a number that can be expressed as a power of 2; however, if the number of memory mats is a number that cannot be expressed as a power of 2, the number of bits of the upper bit section to be used for selection of memory mats becomes large. Therefore, in some cases, the circuit size of the decoder becomes large and its decoding speed becomes slow.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
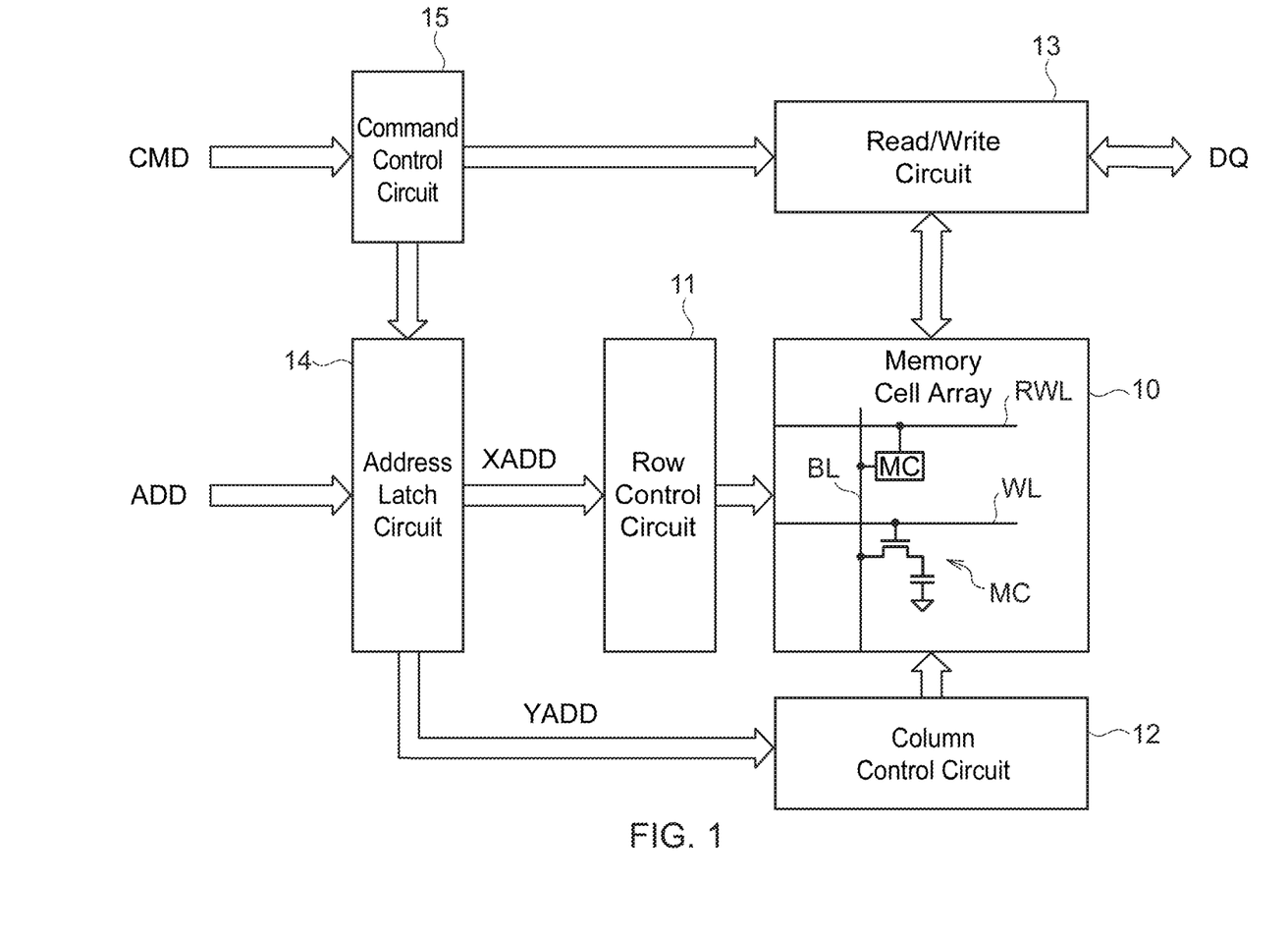
FIG. 1 is a block diagram of a semiconductor device according to the present disclosure.

As shown in FIG. 1, a semiconductor device according to the present disclosure includes a memory cell array 10. The memory cell array 10 includes a plurality of word lines WL and spare word lines RWL that are driven by a row control circuit 11, a plurality of bit lines BL that are connected to a read/write circuit 13, and a plurality of memory cells MC that are arranged at intersections of the word lines WL or the spare word lines RWL and the bit lines BL. The semiconductor device includes an address latch circuit 14 that receives external addresses ADD, and among the external addresses ADD latched in the address latch circuit 14, a row address XADD is supplied to the row control circuit 11 and a column address YADD is supplied to a column control circuit 12. The row control circuit 11 selects one or more word lines WL or one or more spare word lines RWL based on the row address XADD. The column control circuit 12 selects one or more bit lines BL based on the column address YADD. A memory cell MC positioned at an intersection of the selected word line WL or the selected spare word line RWL and the selected bit line BL is connected to the read/write circuit 13. With this configuration, at the time of a read operation, read data DQ read from the memory cell array 10 is output to outside and at the time of a write operation, write data DQ supplied from outside is written in the memory cell array 10.

Operations of the read/write circuit 13 and the address latch circuit 14 are controlled by a command control circuit 15. The command control circuit 15 receives an external command CMD, and an internal command generated based on the external command CMD is supplied to the read/write circuit 13 and the address latch circuit 14. It is also possible that the command control circuit 15 controls operations of other circuits such as the row control circuit 11 and the column control circuit 12.

Figure 2:
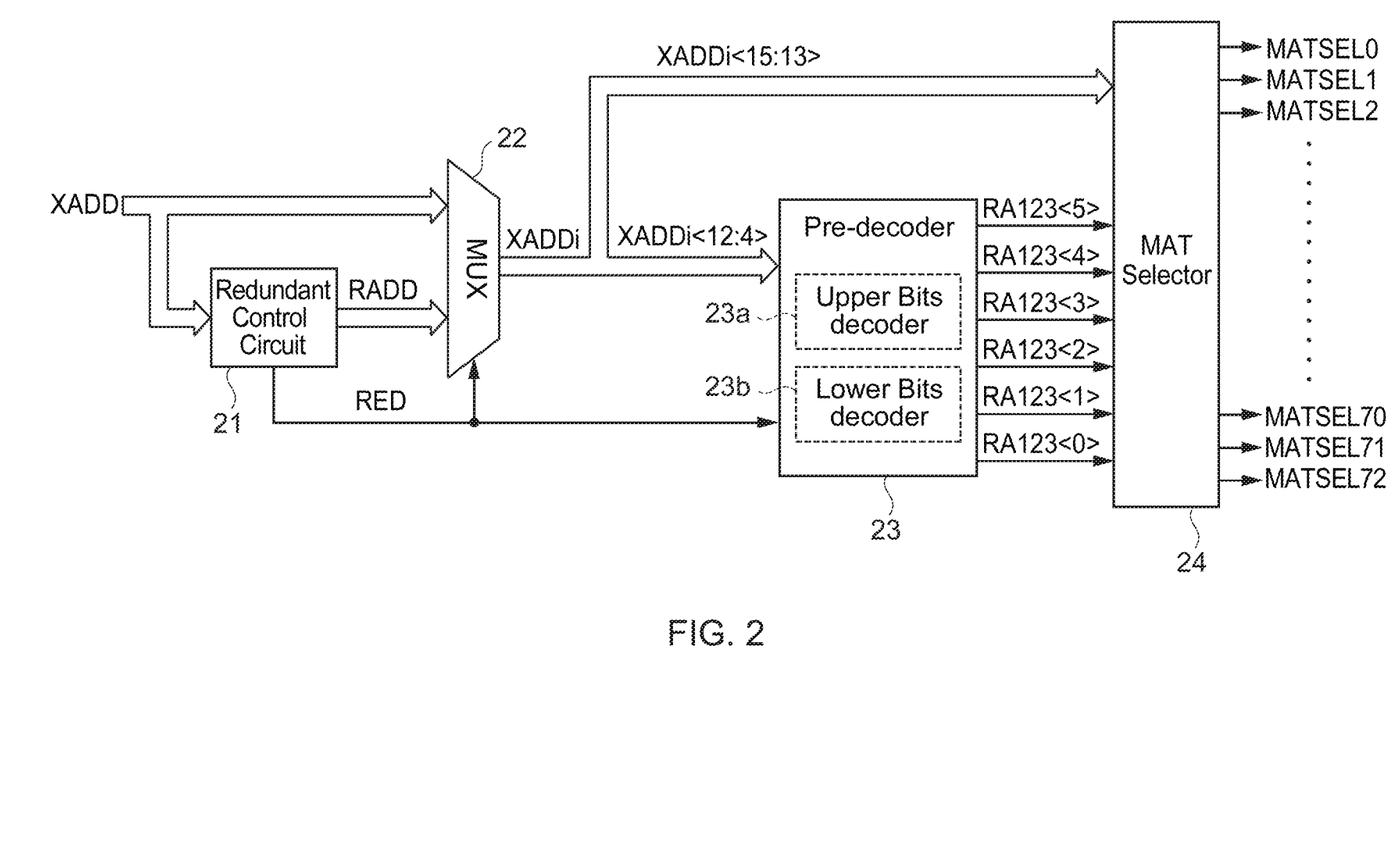
FIG. 2 is a block diagram of a row control circuit according to the present disclosure.

As shown in FIG. 2, the row control circuit 11 includes a redundant control circuit 21. An address of a defective word line WL included in the memory cell array 10 is stored in the redundant control circuit 21, and when the row address XADD matches the address of the defective word line WL, a control signal RED is activated and a redundant address RADD is output. The redundant address RADD indicates an address of a spare word line RWL that is a replacement for the defective word line WL. The row address XADD and the redundant address RADD are supplied to a multiplexer 22. When the control signal RED is in an inactive state, that is, when the row address XADD indicates an address of a word line WL having no defect, the multiplexer 22 selects the row address XADD and outputs the row address XADD as an internal address XADDi. On the other hand, when the control signal RED is in an active state, that is, when the row address XADD indicates an address of a defective word line RWL, the multiplexer 22 selects the redundant address RADD and outputs the redundant address RADD as the internal address XADDi.

Figure 3:
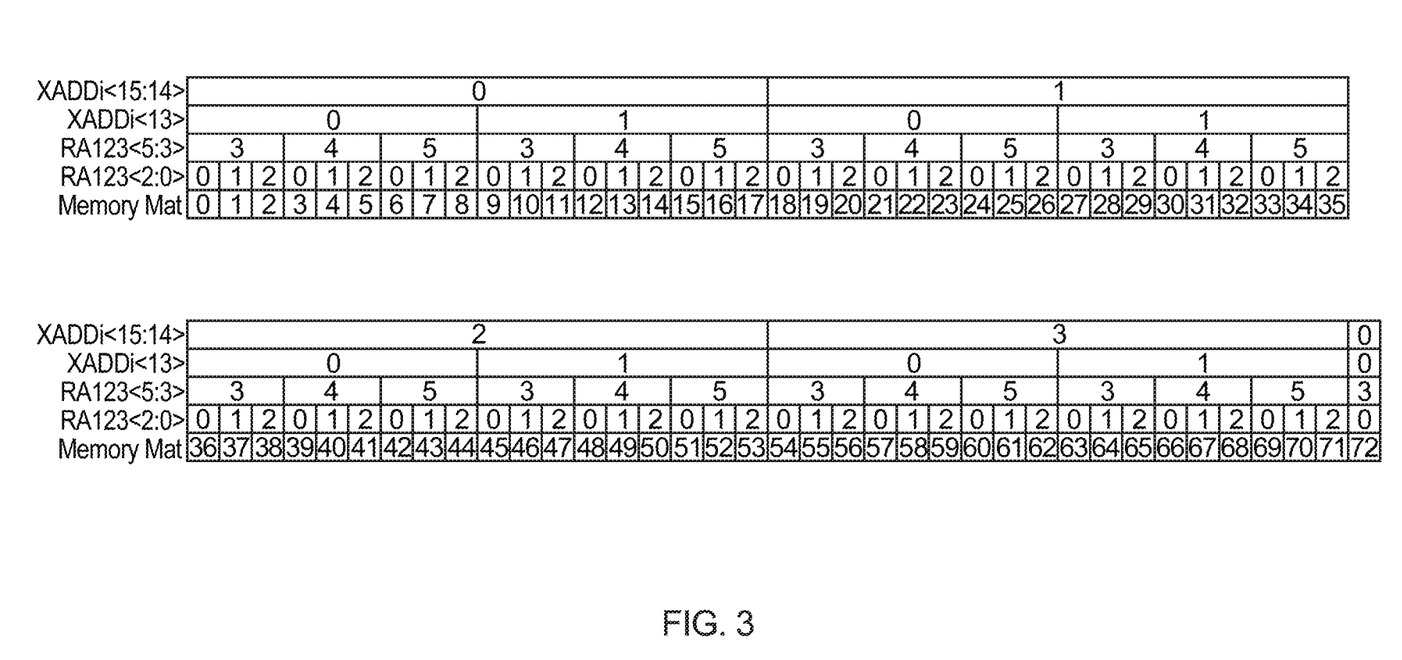
FIG. 3 is a diagram for explaining an address mapping of memory mats according to the present disclosure.

A lower bit section XADDi<12:4> of the internal address XADDi is supplied to a pre-decoder 23, and an upper bit section XADDi<15:13> of the internal address XADDi is supplied to a mat selector 24. The pre-decoder 23 generates an internal address RA123<5:0> by decoding the lower bit section XADDi<12:4> of the internal address XADDi. The mat selector 24 activates any one of mat selection signals MATSEL0 to MATSEL72 based on the upper bit section XADDi<15:13> of the internal address XADDi and the internal address RA123<5:0> output from the pre-decoder 23. The relation between the upper bit section XADDi<15:13> of the internal address XADDi and the internal address RA123<5:0> and the mat selection signals MATSEL0 to MATSEL72 is as shown in FIG. 3. In this example, the mat selection signal MATSEL0 and the mat selection signal MATSEL72 are physically allocated to respective memory mats positioned on one end and the other end of the memory cell array 10, and these signals are activated at the same time. This is because, as for the two memory mats physically positioned on both ends of the memory cell array 10, the number of memory cells MC thereof is half of those of other memory mats, and thus, as the two mats are selected at the same time, it is necessary to secure a memory capacity for one mat. Accordingly, the memory mat selected by the mat selection signal MATSEL0 and the memory mat selected by the mat selection signal MATSEL72 can be regarded as one memory mat in combination. Any one of other mat selection signals MATSEL1 to MATSEL71 is activated exclusively. Therefore, any one of 72 memory mats is selected based on the internal address XADDi.

As shown in FIG. 3, the mat selector 24 selects 9 memory mats from 72 memory mats based on the upper bit section XADDi<15:13>, and then selects any one of the selected 9 memory mats based on the internal address RA123<5:0>. The operation of selecting 9 memory mats from 72 memory mats can be realized by simply decoding the upper bit section XADDi<15:13> formed of 3 bits, and thus the operation can be realized with a very simple circuit. However, in the operation of selecting one memory mat from 9 memory mats, because the number of memory mats is a number that cannot be expressed as a power of 2, when the internal address XADDi<12:4> is simply mapped in order of address, the circuit size of the pre-decoder 23 becomes large. Therefore, not only the chip area thereof is increased but also the required number of stages of a logic gate circuit thereof is increased, and thus the time required for decoding becomes longer. In the present embodiment, in order to solve this problem, a mapping of the internal address XADDi<12:4> with respect to 9 memory mats is improved.

Figure 4:
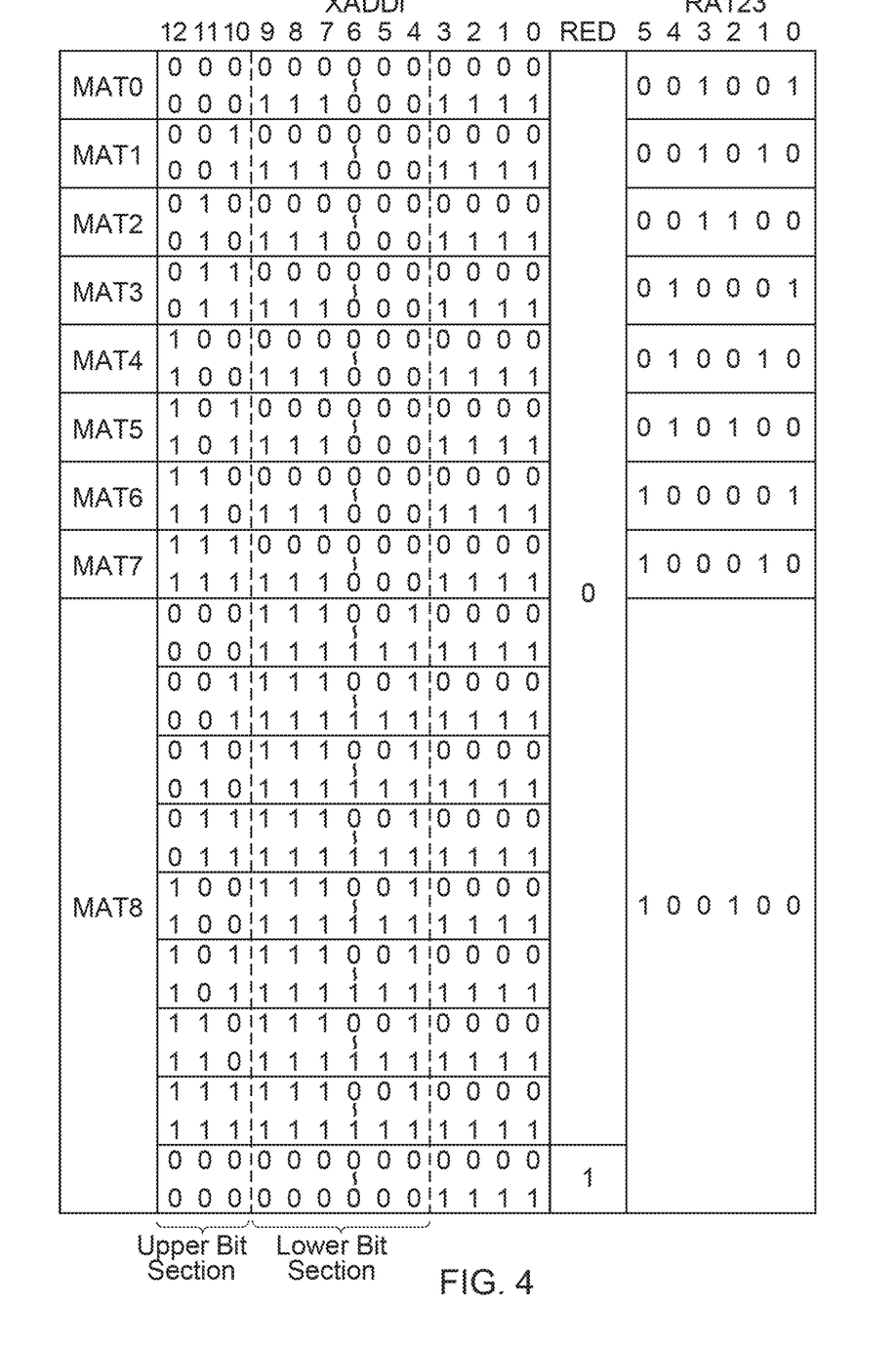
FIGS. 4 and 5 are diagrams for explaining an address mapping of memory mats according to the present disclosure.
Figure 5:
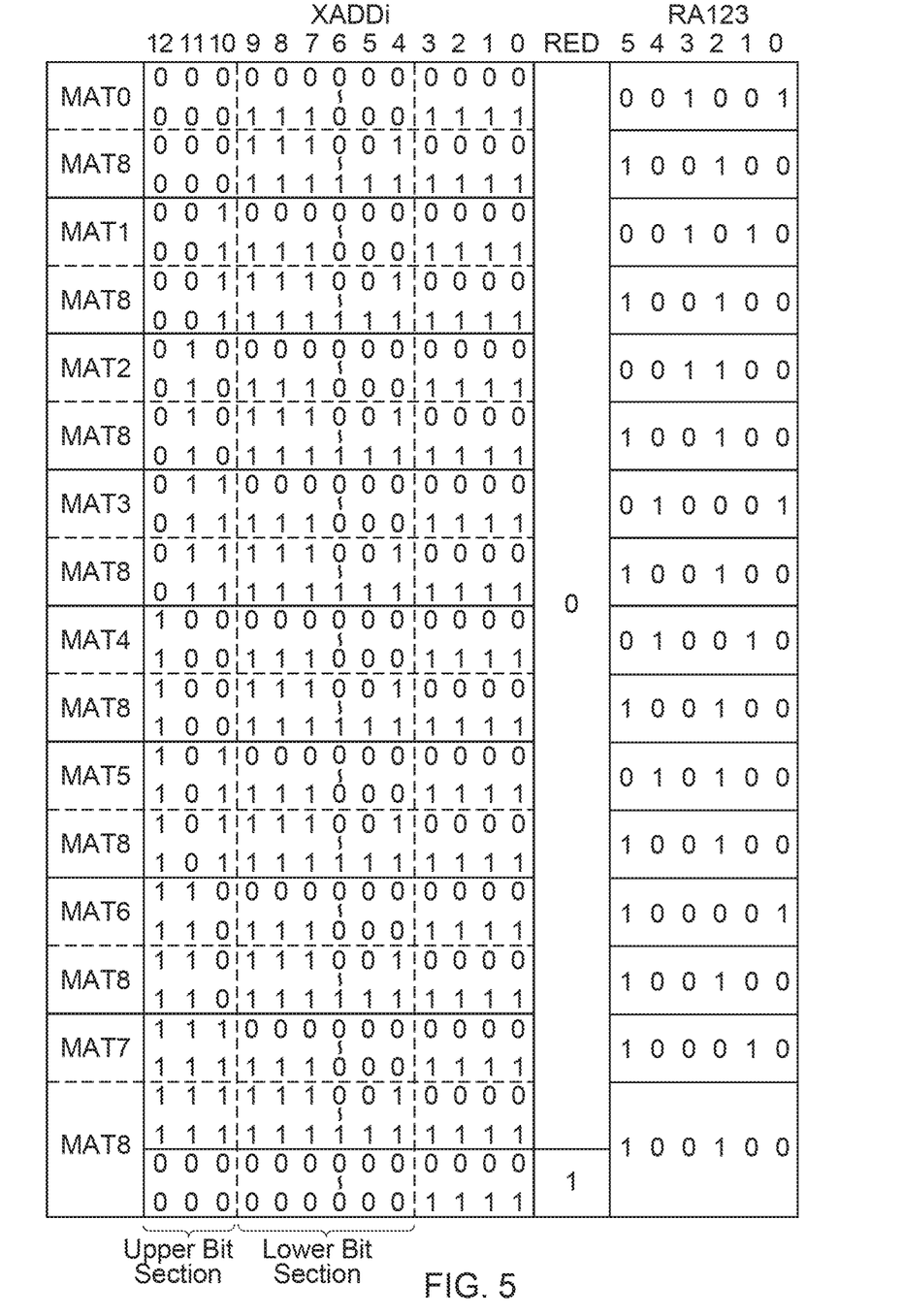

FIGS. 4 and 5 are mapping tables for explaining operations of the pre-decoder 23, and respectively show a relation between an internal address XADDi<12:0> and the internal address RA123<5:0>. Note that, because an internal address XADDi<3:0> is not required for a decoding operation performed by the pre-decoder 23, only the internal address XADDi<12:4> is input to the pre-decoder 23. Further, decoding results MAT0 to MAT8 shown in FIGS. 4 and 5 respectively represent nine types of combinations of the internal address RA123<5:0>. For example, in a case where the decoding result MAT1 is obtained, when the value of the upper bit selection XADDi<15:13> is "000", the mat selection signal MATSEL1 is activated. FIG. 4 is a table in which the internal address XADDi<12:0> is arranged in order of address for each of the decoding results MAT0 to MAT8, and FIG. 5 is a table in which the internal address XADDi<12:0> is arranged in order of address.

As shown in FIGS. 4 and 5, in a case where the internal address XADDi<12:0> is divided into an upper bit section XADD<12:10> and a lower bit section XADD<9:4>, when the value of the lower bit section XADD<9:4> is in a range of "000000" to "111000", any one of the decoding results MAT0 to MAT7 is obtained based on the value of the upper bit section XADD<12:10>. Therefore, when a lower bits decoder 23b shown in FIG. 2 detects that the value of the lower bit section XADD<9:4> is in the range of "000000" to "111000", as an upper bits decoder 23a simply decodes the upper bit section XADD<12:10> formed of 3 bits, any one of the decoding results MAT0 to MAT7 is obtained. On the other hand, when the value of the lower bit section XADD<9:4> is not in the range of "000000" to "111000", that is, when the value of the lower bit section XADD<9:4> is in a range of "111001" to "111111", the decoding result MAT8 is obtained regardless of the value of the upper bit section XADD<12:10>. Therefore, when the lower bits decoder 23b shown in FIG. 2 detects that the value of the lower bit section XADD<9:4> is not in the range of "000000" to "111000", the decoding result MAT8 is obtained without decoding the upper bit section XADD<12:10>.

Figure 6:
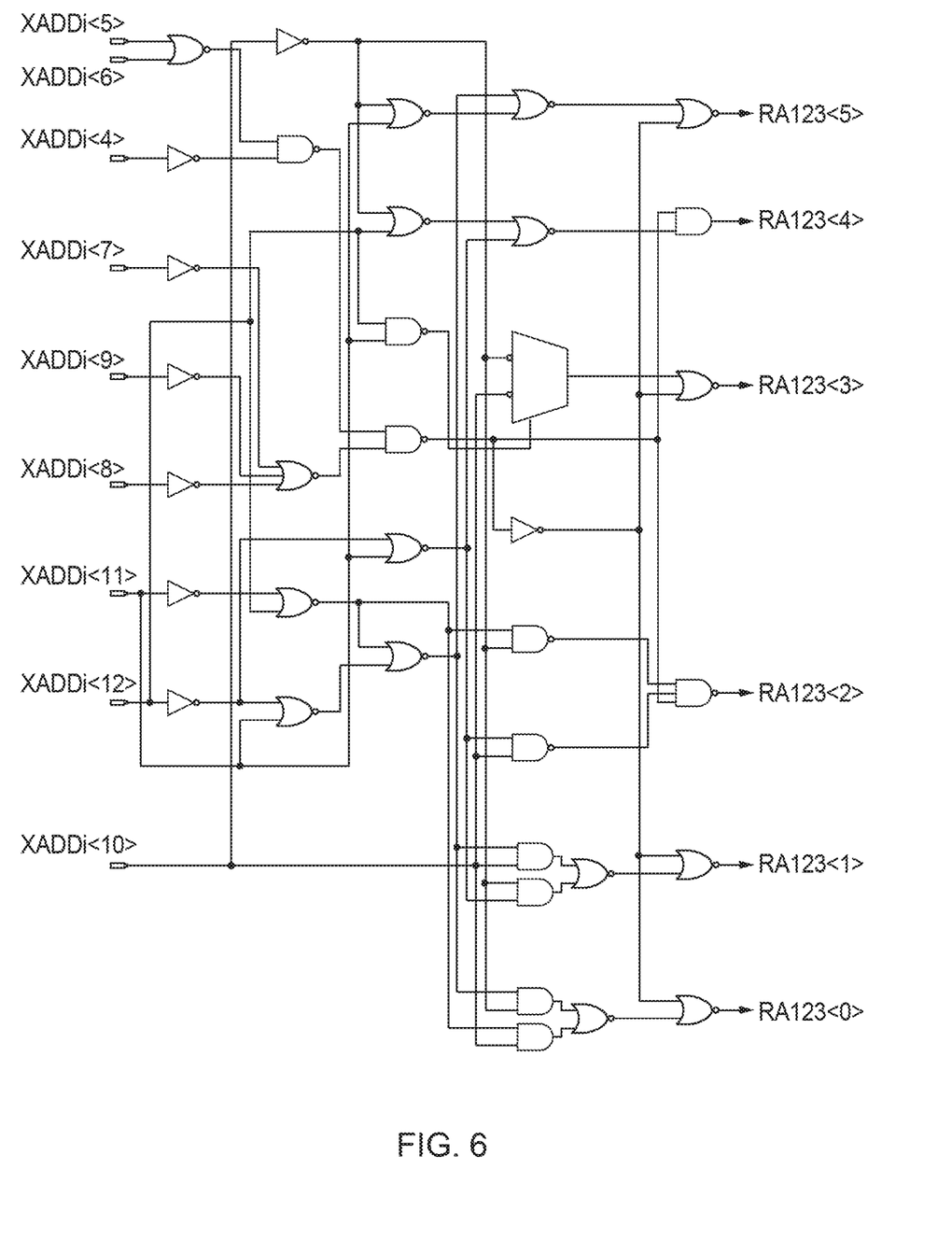
FIG. 6 is a circuit diagram of a pre-decoder according to the present disclosure.

FIG. 6 is a circuit example of the pre-decoder 23. The pre-decoder 23 shown in FIG. 6 has a relatively simple circuit configuration and the required number of stages of the logic gate circuit thereof is five. Meanwhile, when the internal address XADDi<12:0> is simply divided into nine sections in order of address, the value of the internal address XADDi<12:0> indicating respective boundaries of the decoding results MAT0 to MAT8 is different at each of these boundaries, and thus the circuit size of a decoder is enlarged and the required number of stages of the logic gate circuit thereof becomes nine, for example. In this case, the chip area of the pre-decoder 23 is increased and the time required for decoding becomes longer; however, in the present embodiment, a high speed decoding operation can be performed by using a smaller logic circuit.

Further, in the present embodiment, when the control signal RED is activated, the decoding result MAT8 is always obtained. As described above, the control signal RED is activated when the row address XADD matches the address of a defective word line WL. In the present embodiment, 16 spare word lines RWL are prepared for 9 mats, and the value of the redundant address RADD<12:0> is in a range of "0000000000000" to "0000000001111".

Each of the memory mats corresponding to the decoding results MAT0 to MATT has 912 word lines WL, and as to which word line WL is selected is determined by decoding an internal address XADDi<9:0>. Meanwhile, the memory mat corresponding to the decoding result MAT8 has 896 word lines WL and 16 spare word lines RWL, and as to which word line WL or which spare word line RWL is selected is determined by the decoding result of the internal address XADDi<12:0> and the control signal RED. With this configuration, 912 word lines WL or spare word lines RWL in total are included in any of the memory mats, and thus the length of the bit line BL does not become different in respective memory mats.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:
1. An apparatus comprising:
an address output circuit configured to output a first address signal comprising a plurality of bits including a first bit section and a second bit section; and
a decoder circuit configured to decode the first address signal to generate a second address signal,
wherein the second address signal indicates a first output value when the first bit section indicates a first input value and a value of the second bit section is in a first value range,
wherein the second address signal indicates a second output value when the first bit section indicates a second input value and a value of the second bit section is in the first value range, wherein the second address signal indicates a third output value when the first bit section indicates the first input value and a value of the second bit section is in a second value range, and wherein the second address signal indicates the third output value when the first bit section indicates the second input value and a value of the second bit section is in the second value range.

2. The apparatus of claim 1, wherein the second address signal indicates a fourth output value when the first bit section indicates a third input value and a value of the second bit section is in the first value range, and wherein the second address signal indicates the third output value when the first bit section indicates the third input value and a value of the second bit section is in the second value range.

3. The apparatus of claim 2, wherein the second address signal indicates a fifth output value when the first bit section indicates a fourth input value and a value of the second bit section is in the first value range, and wherein the second address signal indicates the third output value when the first bit section indicates the fourth input value and a value of the second bit section is in the second value range.

4. The apparatus of claim 3, wherein the second address signal indicates a sixth output value when the first bit section indicates a fifth input value and a value of the second bit section is in the first value range, and wherein the second address signal indicates the third output value when the first bit section indicates the fifth input value and a value of the second bit section is in the second value range.

5. The apparatus of claim 4, wherein the second address signal indicates a seventh output value when the first bit section indicates a sixth input value and a value of the second bit section is in the first value range, and wherein the second address signal indicates the third output value when the first bit section indicates the sixth input value and a value of the second bit section is in the second value range.

6. The apparatus of claim 5, wherein the second address signal indicates an eighth output value when the first bit section indicates a seventh input value and a value of the second bit section is in the first value range, and wherein the second address signal indicates the third output value when the first bit section indicates the seventh input value and a value of the second bit section is in the second value range.

7. The apparatus of claim 6, wherein the second address signal indicates a ninth output value when the first bit section indicates an eighth input value and a value of the second bit section is in the first value range, and wherein the second address signal indicates the third output value when the first bit section indicates the eighth input value and a value of the second bit section is in the second value range.

8. The apparatus of claim 7, wherein the first bit section is 3-bit signal.

9. The apparatus of claim 1, wherein the second value range is narrower than the first value range.

10. The apparatus of claim 7, wherein the second value range is smaller than one-eighth of the first value range.

11. The apparatus of claim 10, wherein the second address signal indicates the third output value when a control signal is activated.

12. The apparatus of claim 11, wherein the control signal is activated when the first address signal indicates a predetermined value.

13. The apparatus of claim 1, further comprising a memory cell array divided into a plurality of memory mats, wherein one of the memory mats is selected based on the second address signal.

14. An apparatus comprising:

an address output circuit configured to output a first address signal comprising a plurality of bits including a first bit section and a second bit section; and a decoder circuit configured to decode the first address signal to generate a second address signal, wherein the decoder circuit decides an output value of the second address signal based on the first bit section when a value of the second bit section is in a first value range, and wherein the decoder circuit decides the output value of the second address signal regardless of the first bit section when a value of the second bit section is in a second value range.

15. The apparatus of claim 14, wherein the second value range is narrower than the first value range.

16. The apparatus of claim 14, wherein the first bit section comprises upper bits of the first address signal, and wherein the second bit section comprises lower bits of the first address signal.

17. The apparatus of claim 14, wherein the decoder circuit decides the output value of the second address signal based on a part of the second bit section regardless of a remaining part of the second bit section when the second bit section is in the first value range.

18. The apparatus of claim 14, wherein the decoder circuit brings the output value of the second address signal into a first value when the second bit section is in the second value range, and wherein the decoder circuit brings the output value of the second address signal into the first value regardless of the first address signal when a control signal is activated.

19. An apparatus comprising:

a memory cell array divided into a plurality of memory mats, each of the memory mat including a plurality of word lines; and a row control circuit configured to select one of the memory mats and to select one of the word lines in a selected one of the memory mats based on an address signal comprising a plurality of bits including a first bit section, a second bit section, and a third bit section, wherein the row control circuit selects one of the memory mats based on the first bit section when the second bit section is in a first value range, wherein the row control circuit selects a predetermined one of the memory mats regardless of the first bit section when the second bit section is in a second value range, and wherein the row control circuit activates one of the word lines in the selected one of the memory mats based on the first, second, and third bit sections.

20. The apparatus of claim 19, wherein a number of the memory mats is different from power of two.

* * * * *

UNITED STATES PATENT AND TRADEMARK OFFICE
CERTIFICATE OF CORRECTION

| | | |
|---|---|---|
| PATENT NO. | : 10,672,444 B1 | Page 1 of 1 |
| APPLICATION NO. | : 16/219671 | |
| DATED | : June 2, 2020 | |
| INVENTOR(S) | : Satoshi Yamanaka | |

It is certified that error appears in the above-identified patent and that said Letters Patent is hereby corrected as shown below:

At item (54), the title reads as "DECODER UNIT", when the title should read as "DECODER CIRCUIT".

Signed and Sealed this
Eighth Day of September, 2020

Andrei Iancu
*Director of the United States Patent and Trademark Office*